United States Patent [19]

Yamada et al.

[11] Patent Number: 4,542,370

[45] Date of Patent: Sep. 17, 1985

[54] CASCADE-COMPARATOR A/D CONVERTER

[75] Inventors: Hisashi Yamada, Yokohama; Shoichi Shimizu, Fujisawa, both of Japan

[73] Assignee: Tokyo Shibaura Denki Kabushiki Kaisha, Kawasaki, Japan

[21] Appl. No.: 419,475

[22] Filed: Sep. 17, 1982

[30] Foreign Application Priority Data

Oct. 20, 1981 [JP] Japan .................. 56-167548
Oct. 20, 1981 [JP] Japan .................. 56-167550

[51] Int. Cl.$^4$ ........................................ H03K 13/175
[52] U.S. Cl. ........................... 340/347 AD; 307/361
[58] Field of Search ............ 340/347 AD; 324/99 D; 307/360, 361

[56] References Cited

U.S. PATENT DOCUMENTS 3,298,014 1/1967 Stephenson .
3,585,631 6/1971 McCown .................. 340/347 AD
3,597,761 8/1971 Fraschilla et al. .
4,008,468 2/1977 Imhoff .

*Primary Examiner*—Charles D. Miller
*Attorney, Agent, or Firm*—Oblon, Fisher, Spivak, McClelland & Maier

[57] ABSTRACT

In an A/D converter in which a first comparator A/D converter for providing the most significant bits of a digital output and a second comparator A/D converter for providing the least significant bits of the digital output are cascaded, a switching circuit is provided between the first A/D converter and the second A/D converter. This switching circuit is responsive to the comparison between an analog input voltage and first comparison reference voltages in the first A/D converter to apply two adjacent first reference voltages between which the analog input voltages lies to both ends of a voltage dividing circuit network of the second A/D converter to thereby provide second comparison reference voltages. In the second A/D converter, the second comparison reference voltages are compared with the analog input voltage by comparators, to provide the least significant bits of a digital output.

21 Claims, 9 Drawing Figures

CASCADE-COMPARATOR A/D CONVERTER

BACKGROUND OF THE INVENTION

The present invention relates to a cascade-comparator analog-to-digital (A/D) converter.

An A/D converter is known in which a first-stage comparator A/D converter for providing the most significant bits of a digital output and a second-stage comparator A/D converter for providing the least significant bits of the digital output are cascaded. In the first-stage converter first voltage comparators compares an analog input signal level to be converted into digital form with a plurality of first reference voltage levels and a first decoder provides the most significant bits in response to the comparison result. The most significant bits are converted by a digital-to-analog (D/A) converter into an analog voltage, and the difference between the converted analog voltage and the analog input signal is obtained. In the second stage converter, the analog voltage difference is compared by second voltage comparators with a plurality of second reference voltage levels, and a second decoder produces the least significant bits on the basis of the comparison result. The step size of the second reference voltage levels is set to $\frac{1}{2^n}$ (n represents the number of the least significant bits) of the step size of the first reference voltage levels.

Such a cascade-comparator A/D converter can perform in principle an A/D conversion with high accuracy and at high speed. When the conversion accuracy of the local D/A converter for converting the digital output of the first stage converter into an analog voltage is, however, insufficient, an error feasily occurs in the least significant bits. In other words, it was difficult to perform the A/D conversion in high accuracy by the conventional cascade-comparator A/D converter without providing a high accuracy D/A converter. The provision of the local D/A converter complicates the construction of the A/D converter.

SUMMARY OF THE INVENTION

It is an object of the present invention to provide a cascade-comparator A/D converter which is simple in construction by eliminating a local D/A converter and which is arranged to purely digitally convert an analog signal into digital form with high accuracy.

The above object of this invention is achieved by providing a switching circuit between a first-stage comparator A/D converter and a second-stage comparator A/D converter which is responsive to outputs of first comparators for comparing an analog input voltage with first comparison reference voltages to apply two adjacent first reference voltages between which the analog input voltage lies to both ends of a voltage dividing circuit of the second-stage A/D converter which provides second comparison reference voltages.

DETAILED DESCRIPTION OF THE PREFERRED EMBODIMENTS

The cascade-comparator A/D converter embodying the present invention will now be described in connection with a 4-bit A/D converter.

Figure 1:
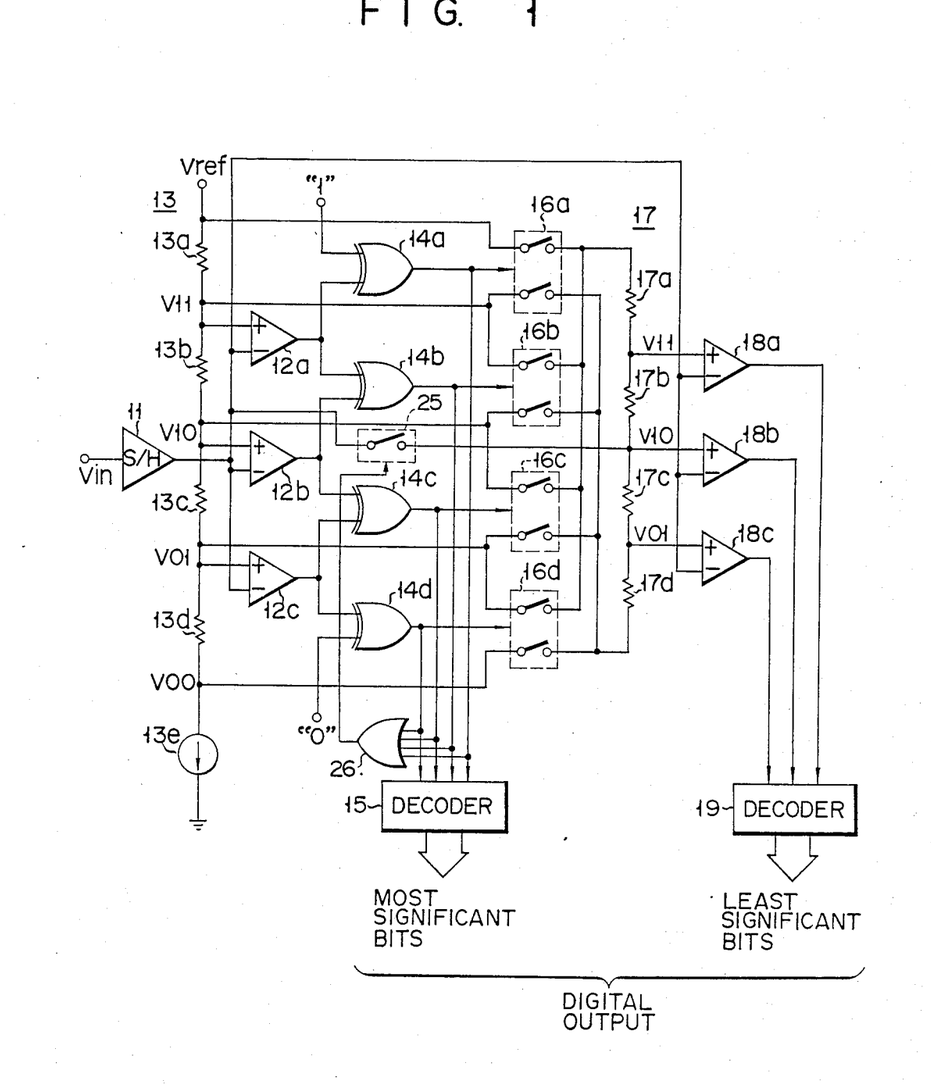
FIG. 1 shows a cascade-comparator A/D converter according to an embodiment of the present invention.

In FIG. 1, an analog input signal to be converted into digital form is sampled and held by a sample-hold (S/H) circuit 11, and then applied commonly to inverting inputs of voltage comparators 12a, 12b and 12c. Comparison reference voltages $V_{01}$, $V_{10}$ and $V_{11}$ provided by a reference voltage generator 13 are applied to non-inverting inputs of comparators 12a, 12b and 12c, respectively, so that the analog input signal voltage is compared by comparators 12a, 12b, 12c with first reference voltages $V_{01}$, $V_{10}$ and $V_{11}$.

Reference voltage generator 13 consists of a voltage dividing circuit network which has four resistors 13a to 13d of equal value connected in series, one end of the voltage dividing circuit or one end of resistor 13a being connected to a reference voltage Vref, and the other end thereof or one end of resistor 13d being grounded through a constant current source 13e. The step size of the first converter for providing the two most significant bits of a digital output is equal to the difference of two adjacent levels of reference voltages Vref, $V_{11}$, $V_{10}$, $V_{01}$ and $V_{00}$ provided by reference voltage generator 13.

Each of comparators 12a, 12b and 12c is arranged to produce an output of a logic 0 level when the analog input voltage Vin is greater than the comparison level and an output of a logic 1 level when Vin is lower than the comparison level.

Each output of comparators 12a, 12b and 12c is connected to two adjacent circuits of four EXCLUSIVE-OR circuits 14a to 14d. More specifically, the output of comparator 12a is connected to EXCLUSIVE-OR circuits 14a and 14b, the output of comparator 12b is connected to EXCLUSIVE-OR circuits 14b and 14c, and the output of comparator 12c is connected to EXCLUSIVE-OR circuits 14c and 14d. A voltage of logic 1 level is applied to EXCLUSIVE-OR circuit 14a, and a voltage of logic 0 level is applied to EXCLUSIVE-OR circuit 14d. The outputs of EXCLUSIVE-OR circuits 14a to 14d are connected to a decoder 15, which thus provides the two most significant bits of a digital output for the analog input signal voltage Vin. Alternatively, the outputs of comparators 12a, 12b and 12c may be decoded to provide the two most significant bits. Decoder 15 is so arranged as to provide the most significant bits "00" for $V_{01} > Vin \geq V_{00}$, "01" for $V_{10} > Vin \geq V_{01}$, "10" for $V_{11} > Vin \geq V_{10}$ and "11" for $Vref \geq Vin \geq V_{11}$.

Reference voltages Vref, $V_{11}$, $V_{10}$, $V_{01}$ and $V_{00}$ provided by reference voltage generator 13 are coupled to switching circuits 16a, 16b, 16c and 16d which are controlled by outputs of EXCLUSIVE-OR circuits 14a, 14b, 14c and 14d, respectively. Only one switching circuit of switching circuits 16a to 16d is turned ON by a logical 1 level output of the corresponding EXCLUSIVE-OR circuit. As a result, two adjacent reference voltages at both ends of a quantization range between which the analog input signal voltage Vin ranges are coupled to both ends of a voltage dividing circuit 17 having a series connection of resistors 17a to 17d for producing second comparison reference voltages $v_{11}$, $v_{10}$, and $v_{01}$. In this embodiment, switching circuits 16a to 16d are arranged to connect a higher reference voltage from reference voltage generator 13 to one end of resistor 17a and a lower reference voltage to one end of resistor 17d. Resistors 17a to 17d have an equal resistance value and thus the step size of the second stage converter determined by voltage dividing circuit 17 is $\frac{1}{4}$ of the step size of the first stage converter.

The second reference voltages $v_{11}$, $v_{10}$, and $v_{01}$ of voltage dividing circuit 17 are respectively applied to noninverting inputs of comparators 18a, 18b and 18c to inverting inputs of which analog input signal voltage Vin is commonly applied. The outputs of comparators 18a to 18c are coupled to a decoder 19 which provides the two least significant bits.

In the A/D converter thus constructed, when the analog input voltage Vin ranges, for example, between comparison reference voltages $V_{10}$ and $V_{11}$, since $$V_{00} < V_{01} < V_{10} < Vin < V_{11} < Vref,$$

comparator 12a produces an output of logic 1 level, while comparators 12b to 12c produce an output of logic 0 level. As a consequence, only EXCLUSIVE-OR circuit 14b produces an output of logic 1 level, resulting in the conduction of switching circuit 16b. Therefore, reference voltages $V_{11}$ and $V_{10}$ are applied to voltage dividing circuit 17.

Accordingly, when the step size of voltage dividing circuit 17 is v, the second reference voltages produced by voltage dividing circuit 17 are given as below.

$v_{11} = V_{10} + 3v$
$v_{10} = V_{10} + 2v$
$v_{01} = V_{10} + v$

Accordingly, decoder 19 provides the two least significant bits "00" for $V_{10} + v > Vin \geq V_{10}$, "01" for $V_{10} + 2v > Vin \geq V_{10} + v$, "10" for $V_{10} + 3v > Vin \geq V_{10} + 2v$, and "11" for $V_{11} > Vin \geq V_{10} + 3v$.

Thus, a 4-bit digital output is provided for the analog input voltage Vin in the combination of the two most significant bits provided by decoder 15 and the two least significant bits provided by decoder 19. As evident from the foregoing description, according to the A/D converter of the present invention, two adjacent ones of the first reference voltages between which the analog input voltage Vin lies are used directly to produce the second comparison reference voltages adapted to provide the least significant bits. Therefore, an A/D converter of good linearity can be provided according to the present invention.

Further, the A/D converter may be provided, as shown in FIG. 1, with an analog switch 25 between the output of S/H circuit 11 and an output of voltage dividing circuit 17, preferably, the output for providing the middle reference voltage $v_{10}$. Analog switch 25 is controlled by OR circuit 26 having inputs connected to the outputs of EXCLUSIVE-OR circuits 14a to 14d such that it is closed during the comparison operation of comparators 12a to 12c and it is open during the comparison operation of comparators 18a to 18c. Such an arrangement permits an A/D conversion at high speed. Namely, when analog switch 25 is closed, a stray capacitance arising between resistors of voltage dividing circuit 17 and circuit ground which is peculiar to integrated circuits is charged by an input signal voltage and the charged voltage is held even after analog switch 25 has been opened for the comparison operation of comparators 18a to 18c. As a result, the second comparison reference voltages provided by voltage dividing circuit 17 can settle relatively fast. Therefore, A/D conversion can be achieved in a short time.

Figure 2:
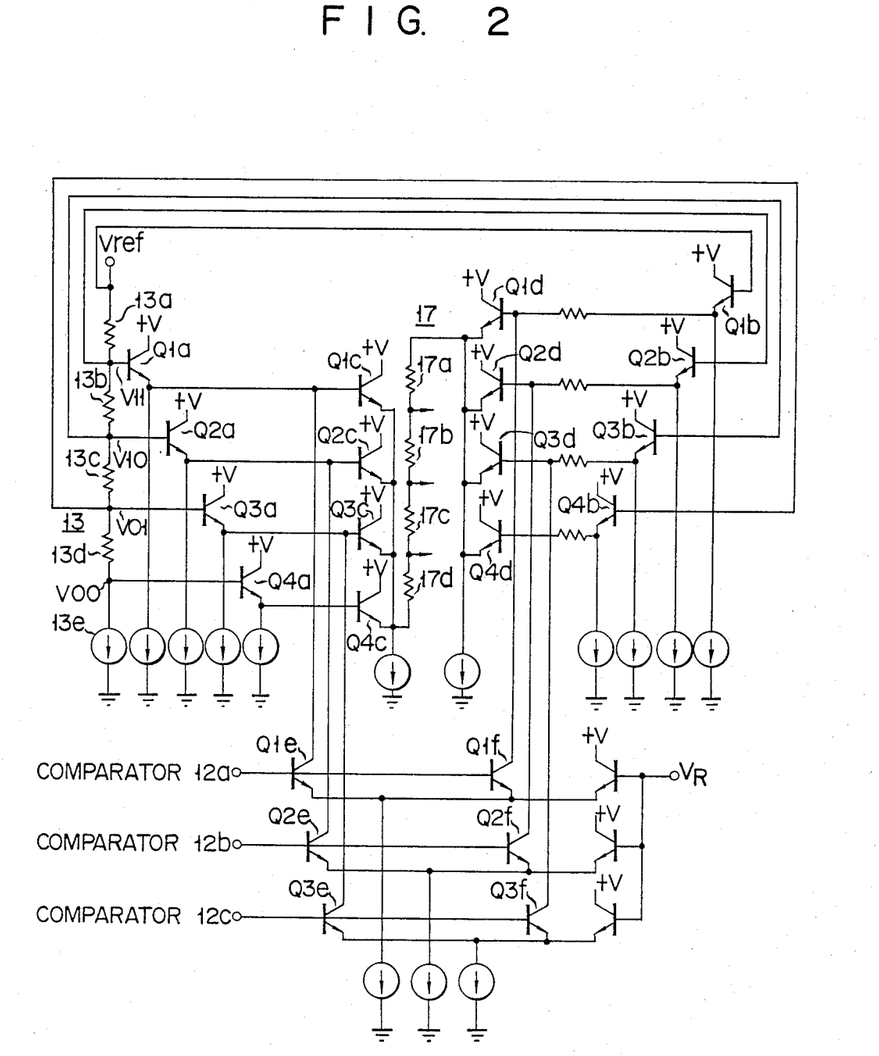
FIG. 2 shows a practical arrangement of the switching circuit in FIG. 1.

FIG. 2 shows a practical arrangement of the A/D converter of FIG. 1, and particularly an arrangement for performing the functions of switching circuits and EXCLUSIVE-OR circuits.

The reference voltages $V_{11}$, $V_{10}$, $V_{01}$ and $V_{00}$ produced by reference voltage generator 13 are respectively coupled to the bases of emitter-follower transistors $Q_{1a}$ to $Q_{4a}$, while the reference voltages Vref, $V_{11}$, $V_{10}$ and $V_{01}$ are respectively coupled to the bases of emitter-follower transistors $Q_{1b}$ to $Q_{4b}$. The emitter outputs of transistors $Q_{1a}$ to $Q_{4a}$ are respectively coupled to the bases of current-switch transistors $Q_{1c}$ to $Q_{4c}$ having their emitters connected together, while the emitter outputs of transistors $Q_{1b}$ to $Q_{4b}$ are respectively coupled to the bases of current-switch transistors $Q_{1d}$ to $Q_{4d}$ having their emitters connected together. Voltage dividing circuit 17 is connected between the emitters of transistors $Q_{1d}$ to $Q_{4d}$ and the emitters of transistors $Q_{1c}$ to $Q_{4c}$. The outputs of comparators 12a, 12b and 12c are respectively coupled to the bases of emitter-coupled switching transistor pairs $Q_{1e}$, $Q_{1f}$, $Q_{2e}$, $Q_{2f}$, $Q_{3e}$, $Q_{3f}$. The collectors of transistors $Q_{1e}$ and $Q_{1f}$ are respectively connected to the bases of transistors $Q_{1c}$ and $Q_{1d}$, the collectors of transistors $Q_{2e}$ and $Q_{2f}$ are respectively connected to the bases of transistors $Q_{2c}$ and $Q_{2d}$, and the collectors of transistors $Q_{3e}$ and $Q_{3f}$ are respectively connected to the bases of transistors $Q_{3c}$ and $Q_{3d}$.

In the arrangement thus constructed, when the analog input voltage Vin is between $V_{10}$ and $V_{11}$, comparator 12a produces an output of logic 1 level, and comparators 12b and 12c produces an output of logic 0 level. As a result, switching transistors $Q_{1e}$ and $Q_{1f}$ are turned ON, while switching transistors $Q_{2e}$, $Q_{3d}$, $Q_{2f}$ and $Q_{3f}$ are turned OFF. Therefore, current-switch transistors $Q_{1c}$ and $Q_{1d}$ are not supplied with base current and thus turned OFF. Current-switch transistors $Q_{2c}$ and $Q_{2d}$ are respectively turned ON by the outputs of emitter-follower transistors $Q_{2a}$ and $Q_{2b}$ so that their emitters are respectively maintained substantially at $V_{10}$ and $V_{11}$. Thus, the remaining current-switch transistors $Q_{3c}$, $Q_{4c}$, $Q_{3d}$ and $Q_{4d}$ are turned OFF because the emitter potential of each of the said current-switch transistors becomes higher than the base potential thereof. As a result, the reference voltages $V_{11}$ and $V_{10}$ are applied to the both ends of voltage dividing circuit 17, which thus produces secondary reference voltages $v_{11}$, $v_{10}$, $v_{01}$ based on analog input voltage Vin.

Figure 3A:
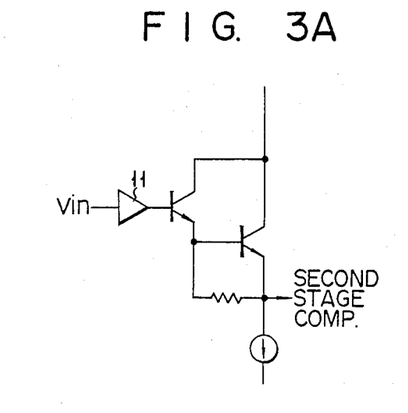
FIGS. 3A and 3B show a level shifting circuit for the analog input voltage supplied to the second A/D converter when the switching circuit in FIG. 2 is used.
Figure 3B:
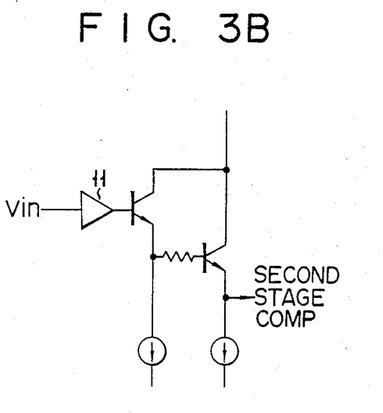

In the arrangement of FIG. 2, the reference voltages applied to voltage dividing circuit 17 are each lowered by base-to-emitter voltages of an emitter-follower transistor and a current-switch transistor. Accordingly, in this case, it is preferred to insert such a level shifting circuit as shown in FIGS. 3A and 3B between comparators 18a, 18b and 18c of the second stage converter and S/H circuit 11. The level shifting circuit of FIG. 3A shifts the analog input voltage in the same amount as the level shift of the reference voltage by Darlington-connected transistors. FIG. 3B shows two-stage emitter-follower circuit which provides the analog input voltage with a desired level shift.

Figure 4:
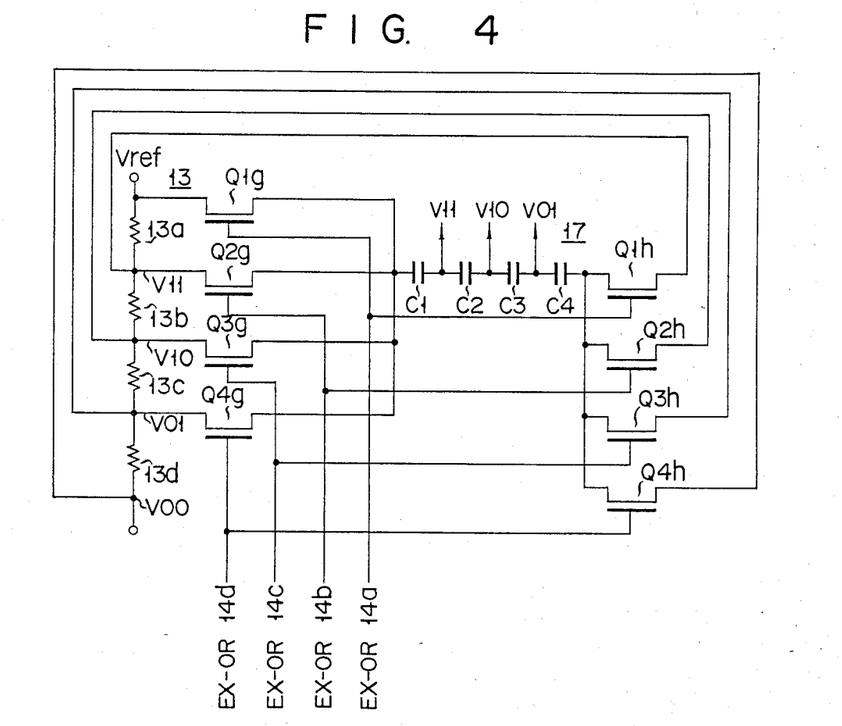
FIG. 4 shows a switching circuit composed of MOS transistors.

The switching circuit may be composed of MOS transistors as shown in FIG. 4. The reference voltages Vref, $V_{11}$, $V_{10}$, $V_{01}$ are respectively coupled to first terminals of MOS transistors $Q_{1g}$ to $Q_{4g}$, and the reference voltages $V_{11}$, $V_{10}$, $V_{01}$ and $V_{00}$ are respectively coupled to first terminals of MOS transistors $Q_{1h}$ to $Q_{4h}$. Voltages dividing circuit 17 for producing secondary comparison reference voltages $v_{11}$, $v_{10}$, $v_{01}$ is connected between commonly connected second terminals of transistors $Q_{1g}$ to $Q_{4g}$ and commonly connected second terminals of transistors $Q_{1h}$ to $Q_{4h}$. Voltage dividing circuit 17 may be a resistance dividing circuit as described above, but may also be, as shown, a capacitance dividing circuit in which capacitors $C_1$ to $C_4$ of an equal capacitance are connectecd in series. The transistor pairs $Q_{1g}$ and $Q_{1h}$; $Q_{2g}$ and $Q_{2h}$; $Q_{3g}$ and $Q_{3h}$; and $Q_{4g}$ and $Q_{4h}$ are respectively controlled by the outputs of EXCLUSIVE-OR circuits 14a to 14d shown in FIG. 1.

In the embodiment described above, a high voltage supply terminal and a low voltage supply terminal of the voltage dividing circuit for producing the secondary comparison reference voltages are predetermined. Therefore, there is a disadvantage that the number of the switching elements increases.

Figure 5:
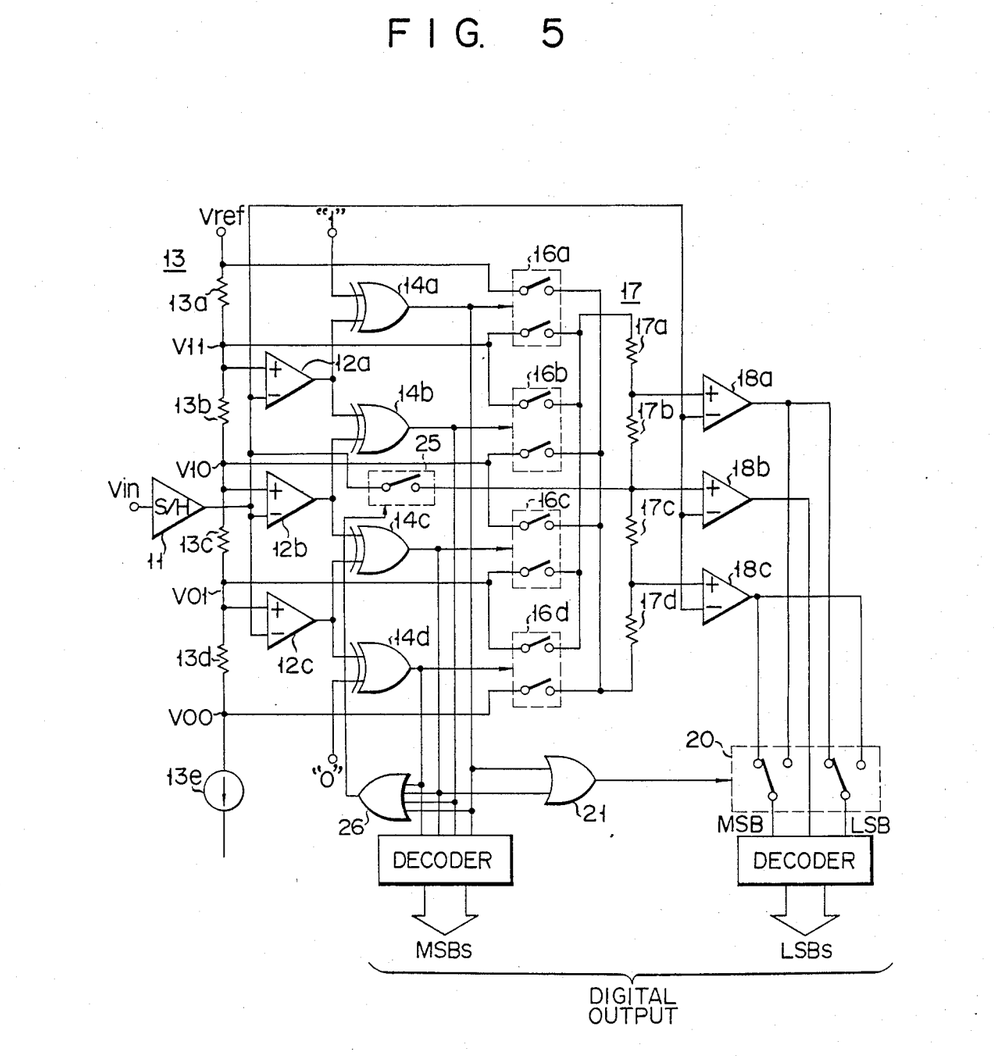
FIG. 5 shows a cascade-comparator A/D converter according to another embodiment of the present invention.

An embodiment of the A/D converter arranged to reduce the number of the switching elements will now be described. FIG. 5 shows a second embodiment of the A/D converter of the present invention in which supply terminals for odd-numbered reference voltages Vref, $V_{10}$ and $V_{00}$ and even-numbered reference voltages $V_{11}$ and $V_{01}$ of reference voltages Vref, $V_{11}$, $V_{10}$, $V_{01}$ and $V_{00}$ are predetermined.

Figure 6:
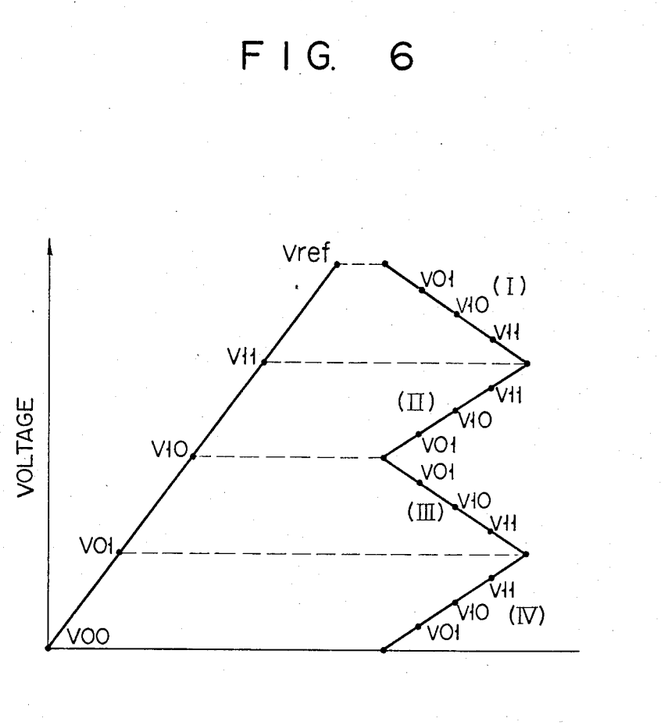
FIG. 6 is a diagram for better understanding of the operation of the A/D converter in FIG. 5.

More specifically, in this embodiment, switching circuits 16a to 16d are arranged to couple the odd-numbered reference voltages Vref, $V_{10}$ and $V_{00}$ to the voltage supply terminal of voltage dividing circuit 17 at the side of resistor 17a, and also couple the even-numbered reference voltages $V_{11}$ and $V_{01}$ to the voltage supply terminal at the side of resistor 17a. Thus, as shown in FIG. 6, the relationship of the magnitudes of secondary reference voltages $v_{11}$ and $v_{01}$ provided by voltage dividing circuit 17 is reversed in the adjacent ranges of the quantization ranges adapted for providing the most significant bits. Therefore, the bit weight of the outputs of comparators 18a and 18c coupled to decoder 19 is also reversed in the adjacent quantization ranges. A switching circuit 20 is provided between comparators 18a, 18c and decoder 19 to switch the bit weight of the outputs of comparators 18a and 18c coupled to decoder 19 for every quantization range to thereby obtain correct least significant bits. Switching circuit 20 is switched by an OR circuit 21 having inputs connected to the outputs of EXCLUSIVE-OR circuits 14a and 14c.

As shown in FIG. 6, in the quantization ranges (I) and (III), $v_{01} > v_{11}$. Therefore, in this case, the outputs of comparators 18c and 18a are coupled to decoder 19 as MSB and LSB, respectively. On the other hand, in the quantization ranges (II) and (IV), $v_{11} > v_{01}$. Therefore, the outputs of comparators 18a and 18c are coupled to decoder 19 as MSB and LSB, respectively. In this manner, the same two least significant bits as those of the embodiment of FIG. 1 can be provided.

Figure 7:
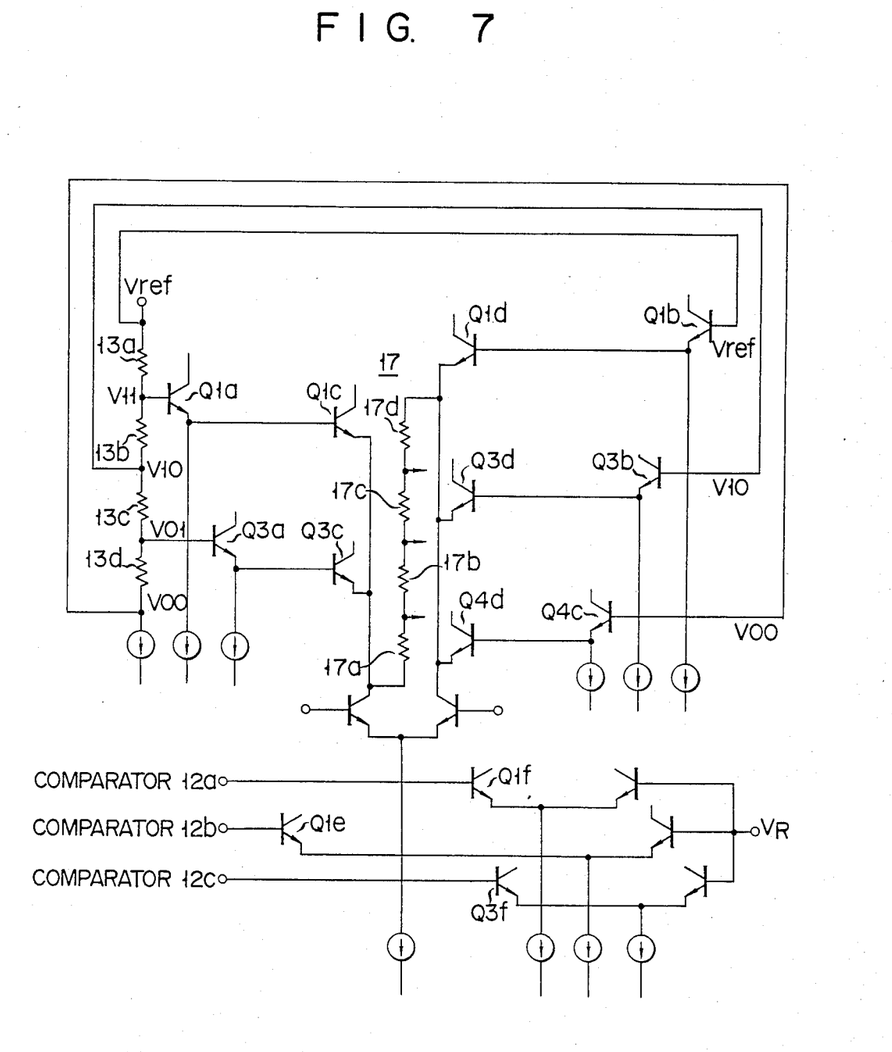
FIG. 7 shows a practical arrangement of the switching circuit of the A/D converter of FIG. 5.

FIG. 7 shows a practical arrangement using bipolar transistors for performing the functions of the switching circuits and the EXCLUSIVE-OR circuits of the A/D converter of FIG. 5. In order to readily compare it with the arrangement of FIG. 2, the same reference numerals are used to designate the elements corresponding to those of FIG. 2. As evident in this second embodiment, the number of the switching elements is reduced as compared with that in the first embodiment of the present invention.

Figure 8:
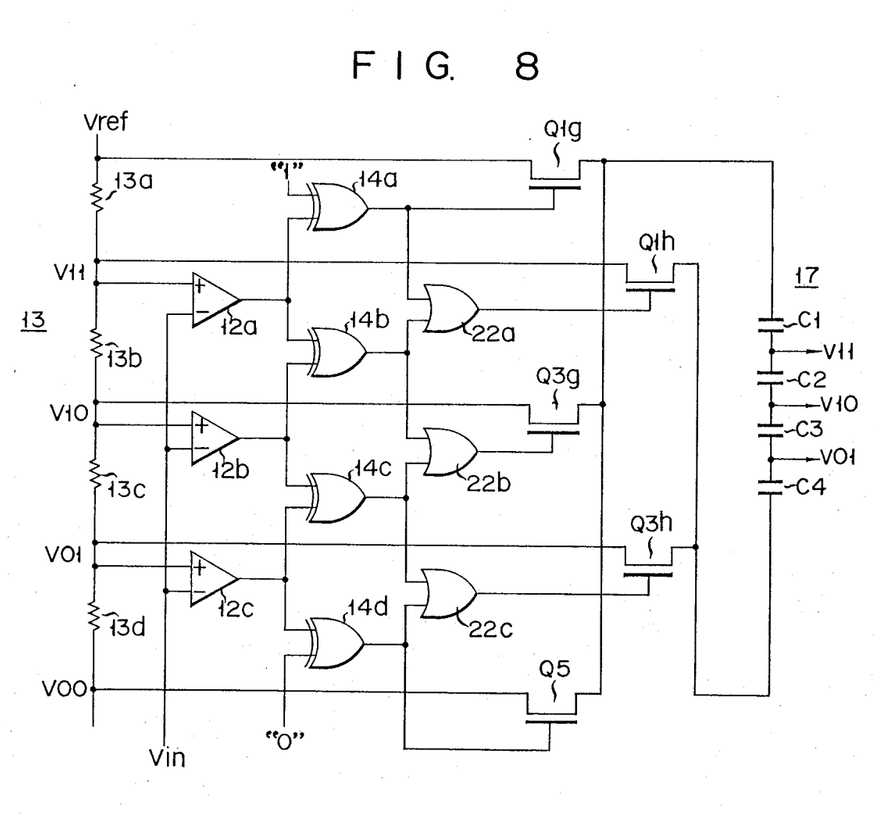
FIG. 8 shows the switching circuit using MOS transistors.

FIG. 8 shows an arrangement formed of MOS transistors for the switching circuits. Transistor $Q_{1g}$ is controlled by the output of EXCLUSIVE-OR circuit 14a, and transistor $Q_{1h}$ is controlled by the output of EXCLUSIVE-OR circuit 14a or 14b via an OR circuit 22a. Transistor $Q_{3g}$ is controlled by the output of EXCLUSIVE-OR circuit 14b or 14c via an OR circuit 22b, transistor $Q_{3h}$ is controlled by the output of EXCLUSIVE-OR circuit 14c or 14d via an OR circuit 22c, and a transistor $Q_5$ is controlled by the output of EXCLUSIVE-OR circuit 14d.

The present invention has been described in connection with a 4-bit A/D converter, but the number of bits of digital output is not limited to four.

What we claim is:

1. An analog-to-digital converter comprising:
   first comparison reference voltage providing means for providing a plurality of first comparison reference voltages of different magnitude to determine the quantization ranges of an analog input voltage to be converted into a digital signal;
   first comparator means for comparing the analog input voltage with the first comparison reference voltages;
   first decoding means for providing higher order bits of the digital signal in response to outputs of said first comparator means;
   switching circuit means connected to receive the first comparison reference voltages from said first comparison reference voltage providing means and responsive to said first comparator means for providing two adjacent first reference voltages between which the analog input voltage lies to first and second outputs of said switching circuit means;
   second comparison reference voltage providing means connected between said first and second outputs of said switching circuit means for providing a plurality of second comparison reference voltages within said two adjacent first reference voltages;
   second comparator means for comparing the analog input voltage with the second comparison reference voltages; and
   second decoding means for producing lower order bits of the digital signal in response to outputs of said second comparator means;
   wherein said second comparison reference voltage providing means comprises a series combination of a plurality of capacitors of an equal capacitance value connected between said first and second outputs of said switching circuit means.

2. An analog-to-digital converter according to claim 1, wherein said switching circuit means is arranged to provide a higher one and a lower one of said two adjacent first reference voltages to said first and second outputs, respectively.

3. An analog-to-digital converter according to claim 1, wherein the first comparison reference voltages are numbered in the order of magnitude, and said switching circuit means is arranged to provide an odd-numbered one and an even-numbered one of said two adjacent first reference voltages to said first and second outputs, respectively.

4. An analog-to-digital converter according to claim 1, wherein said switching circuit means comprises bipolar transistors as switching elements.

5. An analog-to-digital converter according to claim 1, wherein said switching circuit means comprises MOS transistors as switching elements.

6. An analog-to-digital converter according to claim 1, wherein said switching circuit means comprises emitter-follower stages for coupling reference voltages of said first comparison reference voltage providing means to said first and second outputs of said switching circuit means, and a level shifting circuit is provided for coupling the analog input voltage to said second comparator means.

7. An analog-to-digital converter comprising:
first comparison reference voltage providing means for providing a plurality of first comparison reference voltages of different magnitude to determine the quantization ranges of an analog input voltage to be converted into a digital signal;
first comparator means for comparing the analog input voltage with the first comparison reference voltages;
first decoding means for providing higher order bits of the digital signal in response to outputs of said first comparator means;
switching circuit means connected to receive the first comparison reference voltages from said first comparison reference voltage providing means and responsive to said first comparator means for providing two adjacent first reference voltages between which the analog input voltage lies to first and second outputs of said switching circuit means;
second comparison reference voltage providing means connected between said first and second outputs of said switching circuit means for providing a plurality of second comparison reference voltages within said two adjacent first reference voltages;
second comparator means for comparing the analog input voltage with the second comparison reference voltages;
second decoding means for producing lower order bits of the digital signal in response to outputs of said second comparator means; and
an analog switch for coupling the analog input voltage to said second comparison reference voltage providing means and means for enabling said analog switch to couple the analog input voltage to said second comparison reference voltage providing means during the comparison operation of said first comparator means and disabling said analog switch from coupling the analog input voltage to said second comparison reference voltage providing means during the comparison operation of said second comparator means.

8. An analog-to-digital converter according to claim 7, wherein said switching circuit means is arranged to provide a higher one and a lower one of said two adjacent first reference voltages to said first and second outputs, respectively.

9. An analog-to-digital converter according to claim 7, wherein the first comparison reference voltages are numbered in the order of magnitude, and said switching circuit means is arranged to provide an odd-numbered one and an even-numbered one of said two adjacent first reference voltages to said first and second outputs, respectively.

10. An analog-to-digital converter according to claim 7, wherein said second comparison reference voltage providing means comprises a series combination of a plurality of resistors of an equal resistance value connected between said first and second outputs of said switching circuit means.

11. An analog-to-digital converter according to claim 7, wherein said second comparison reference voltage providing means comprises a series combination of a plurality of capacitors of an equal capacitance value connected between said first and second outputs of said switching circuit means.

12. An analog-to-digital converter according to claim 7, wherein said switching circuit means comprises bipolar transistors as switching elements.

13. An analog-to-digital converter according to claim 7, wherein said switching circuit means comprises MOS transistors as switching elements.

14. An analog-to-digital converter according to claim 7, wherein said switching circuit means comprises emitter-follower stages for coupling reference voltages of said first comparison reference voltage providing means to said first and second outputs of said switching circuit means, and a level shifting circuit is provided for coupling the analog input voltage to said second comparator means.

15. An analog-to-digital converter comprising:
first comparison reference voltage providing means for providing a plurality of first comparison reference voltages of different magnitude to determine the quantization ranges of an analog input voltage to be converted into a digital signal;
first comparator means for comparing one analog input voltage with the first comparison reference voltages;
first decoding means for providing higher order bits of the digital signal in response to outputs of said first comparator means;
switching circuit means connected to receive the first comparison reference voltages from said first comparison reference voltage providing means and responsive to said first comparator means for providing two adjacent first reference voltages between which the analog input voltage lies to first and second outputs of said switching circuit means;
second comparison reference voltage providing means connected between said first and second outputs of said switching circuit means for providing a plurality of second comparison reference voltages within said two adjacent first reference voltages;
second comparator means for comparing the analog input voltage with the second comparison reference voltages; and
second decoding means for producing lower order bits of the digital signal in response to outputs of said first and second comparator means;
wherein the first comparison reference voltages are numbered in the order of magnitude, and said switching circuit means is arranged to provide an odd-numbered one and an even-numbered one of said two adjacent first reference voltages to said first and second outputs, respectively.

16. An analog-to-digital converter according to claim 15, wherein said second comparison reference voltage providing means comprises a series combination of a plurality of resistors of an equal resistance value connected between said first and second outputs of said switching circuit means.

17. An analog-to-digital converter according to claim 15, wherein said second comparison reference voltage providing means comprises a series combination of a plurality of capacitors of an equal capacitance value connected between said first and second outputs of said switching circuit means.

18. An analog-to-digital converter according to claim 15, wherein said switching circuit means comprises bipolar transistors as switching elements.

19. An analog-to-digit converter according to claim 15, wherein said switching circuit means comprises MOS transistors as switching elements.

20. An analog-to-digital converter according to claim 15, wherein said switching circuit means comprises emitter-follower stages for coupling reference voltages of said first comparison reference voltage providing means to said first and second outputs of said switching circuit means, and a level shifting circuit is provided for coupling the analog input voltage to said second comparator means.

21. An analog-to-digital converter according to claim 15 further comprising an analog switch for coupling the analog input voltage to said second comparison reference voltage providing means and means for enabling said analog switch to couple the analog input voltage to said second comparison reference voltage providing means during the comparison operation of said first comparator means and disabling said analog switch from coupling the analog input voltage to said second comparison reference voltage providing means during the comparison operation of said second comparator means.

* * * * *